US006818562B2

(12) United States Patent
Todorow et al.

(10) Patent No.: US 6,818,562 B2
(45) Date of Patent: Nov. 16, 2004

(54) METHOD AND APPARATUS FOR TUNING AN RF MATCHING NETWORK IN A PLASMA ENHANCED SEMICONDUCTOR WAFER PROCESSING SYSTEM

(76) Inventors: Valentin Todorow, 3300 Wolcott Common #202, Fremont, CA (US) 94538; John Holland, 1565 Calaveros Ave., San Jose, CA (US) 95126; Nicolas Gani, 373 River Oak Cir. #1705, San Jose, CA (US) 95134

( * ) Notice: Subject to any disclaimer, the term of this patent is extended or adjusted under 35 U.S.C. 154(b) by 6 days.

(21) Appl. No.: 10/146,394

(22) Filed: May 14, 2002

(65) Prior Publication Data

US 2003/0196757 A1 Oct. 23, 2003

Related U.S. Application Data

(60) Provisional application No. 60/373,984, filed on Apr. 19, 2002.

(51) Int. Cl.$^7$ .......................... H01L 21/00; H05H 1/00; C23C 16/00
(52) U.S. Cl. .............................. 438/710; 438/9; 438/10; 156/345.24; 156/345.28; 156/345.47; 118/723 I; 118/723 E
(58) Field of Search ............................. 438/9, 10, 710; 427/8, 569; 156/345.24, 345.28, 345.48, 345.47; 118/723 I, 723 E, 712

(56) References Cited

U.S. PATENT DOCUMENTS

| | | | | |
|---|---|---|---|---|
| 5,273,610 A | * | 12/1993 | Thomas et al. | 156/345.28 |
| 5,971,591 A | * | 10/1999 | Vona et al. | 700/220 |
| 6,253,704 B1 | | 7/2001 | Savas | 118/723.1 |
| 6,255,221 B1 | * | 7/2001 | Hudson et al. | 438/710 |
| 6,353,206 B1 | | 3/2002 | Roderick | 219/171.52 |
| 6,472,822 B1 | * | 10/2002 | Chen et al. | 315/111.21 |

FOREIGN PATENT DOCUMENTS

| | | | |
|---|---|---|---|
| DE | 36 13 181 | 10/1987 | H01L/21/308 |
| DE | 39 40 083 | 6/1991 | H01L/21/90 |
| DE | 42 02 447 | 7/1992 | C23F/1/24 |
| DE | 42 04 848 A | 8/1992 | H01L/21/321 |
| EP | 0 200 951 | 12/1986 | H01L/21/306 |
| EP | 0 363 982 | 4/1990 | H01L/21/306 |
| EP | 0 383 570 | 8/1990 | H01L/21/302 |
| EP | 0 497 023 | 8/1992 | H01L/21/306 |
| EP | 0 822 582 | 2/1998 | H01L/21/306 |
| GB | 2 290 413 | 12/1995 | H01L/21/306 |
| JP | 63-13334 | 1/1988 | H01L/21/302 |
| JP | 63-115338 | 5/1988 | H01L/21/302 |
| JP | 3-129820 | 6/1991 | H01L/21/302 |
| JP | H3-129820 | 6/1991 | H01L/21/302 |
| WO | WO 99/10922 | 3/1999 | H01L/21/3065 |
| WO | 99/14855 | 3/1999 | H03H/7/40 |
| WO | 01/84591 A2 | 11/2001 | H01J/37/00 |

OTHER PUBLICATIONS

PCT International Search Report for PCT/US03/09937, dated Jan. 9, 2004 (AMAT/7265.PC).*
Siu, et al. "Effect of Pulsed Plasma, Pressure, and RF Bias on Electron Shading Damage," 2000 5$^{th}$ International Symposium on Plasma Process–Induced Damage, May 23–24, Santa Clara, CA.
Lapucci, et al. "Discharge Impedance Variations in Large Area Radio Frequency Excited CO2 Lasers," Appl. Phys. Lett. 71(14), Oct. 6, 1997.
Annex to From PCT/ISA/206 (Results of the Partial International Search), date Aug. 6, 2003 for PCT/US03/09937.

(List continued on next page.)

Primary Examiner—P. Hassanzadeh
(74) Attorney, Agent, or Firm—Moser, Patterson & Sheridan, L.L.P.; Joseph Bach

(57) ABSTRACT

A method and apparatus for operating a matching network within a plasma enhanced semiconductor wafer processing system that uses pulsed power to facilitate plasma processing.

12 Claims, 3 Drawing Sheets-

OTHER PUBLICATIONS

Okuhira, et al., "Microscopic Processing by Plasma," Hitachi Seisakusho, Central Research Center, Jul. 11, 1989.

B. Mahi et al., "The etching of silicon in diluted $SF_6$ plasmas: Correlation between the flux of incident species and the etching kinetics", J. of Vacuum Sciences & Technology, (1987) May/Jun., No. 3, pp. 657–666.

C.C. Tin, et al., "Effects of RF Bias on Remote Microwave Plasma Assisted Etching of Silicon on $SF_6$" Journal of Electrochemical Society 138, Oct. 1991, pp. 3094–3100.

K. Tsujimoto et al., "A New Side Wall Protection Technique in Microwave Plasma Etching Using A Chopping Method", 1986 International Conf. on Solid State Devices, Tokyo, pp. 229–232.

I.W. Rangelow, "High–Resolution tri–level process by downstream–microwave RF–biased etching", SPIE vol. 1392 Advanced Techniques for Integrated Circuit Processing, (1990) pp. 180–184.

* cited by examiner

METHOD AND APPARATUS FOR TUNING AN RF MATCHING NETWORK IN A PLASMA ENHANCED SEMICONDUCTOR WAFER PROCESSING SYSTEM

CROSS-REFERENCE TO RELATED APPLICATIONS

This application claims benefit of U.S. provisional patent application Ser. No. 60/373,984, filed Apr. 19, 2002, which is herein incorporated by reference.

BACKGROUND OF THE INVENTION

1. Field of the Invention

The present invention generally relates to semiconductor substrate processing systems and, more specifically, to a method and apparatus for operating an RF matching network in a plasma enhanced semiconductor wafer processing system.

2. Description of the Related Art

In semiconductor integrated circuit (IC) fabrication, devices such as component transistors are formed on a semiconductor wafer substrate that is typically made of silicon. During the fabrication process, various materials are deposited on different layers in order to build or form the desired integrated circuit. The various layers define devices that are interconnected by metallization lines. During certain plasma enhanced processes that are performed upon wafers (also referred to in the art as substrates) that already contain devices and metallized lines, a substantial amount of charge may accumulate on the surface of the wafer. This charge accumulation may not be uniform across the wafer. As such the charge accumulation may cause destructive currents to be induced in some of the metallized materials and/or cause arcing within dielectric layers. The currents and/or arcing may destroy or damage certain devices that have previously been formed on the wafer. To mitigate the charging effects and avoid charging damage, the power supplied to a plasma within a plasma enhanced reactor may be pulsed. As such, the power coupled to the plasma is pulsed during all or part of the plasma enhanced process. One example of such a technique for use in an etch reactor is disclosed in U.S. Pat. No. 6,255,221, issued Jul. 3, 2001.

One drawback of using a pulsed plasma etch reactor is that the power from an RF generator or RF source must be coupled through a dynamically tuned matching network (also referred to as a match unit) to an antenna or electrode within a plasma reactor. The pulsed power is coupled from the antenna or electrode to process gases within the reactor to form a plasma that is used for the etching process. The matching network ensures that the output of the RF source is efficiently coupled to the plasma to maximize the amount of energy coupled to the plasma. The matching network matches the, typically, 50 ohms to a complex impedance of the plasma. To facilitate dynamic matching as the plasma characteristics change during processing, the matching network is continuously adjustable to ensure that a match is achieved and maintained throughout processing.

Generally, a controller that executes the process recipe controls the matching network. The controller also monitors the reflected power from the matching network. If the reflected power from the matching network rises, the controller will adjust the capacitance or inductance of the matching network to achieve a more sufficient match for the RF source to the existing plasma within the chamber. Since the matching networks for coupling high power RF energy to a plasma generally contain mechanically tunable elements (i.e., capacitors and/or inductors), the tuning process may be slow compared to the pulse length of the RF pulse that is desired to be coupled to the plasma. As such, when pulsing power into the matching network as the network is adjusted with each pulse, the reflected power may be sporadic or inconsistent with actual reflected power, causing the controller to under or over adjust the matching network. Such continuous adjustment may cause excessive reflected power and a reduction in plasma power coupling efficiency.

Therefore, there is a need in the art for a method and apparatus for operating a matching network in a plasma enhanced semiconductor wafer processing system that uses pulsed power.

SUMMARY OF THE INVENTION

The present invention is a method and apparatus for operating a matching network within a plasma enhanced semiconductor wafer processing system that uses pulsed power for plasma processing. The invention comprises a circuit for monitoring an indicator of match accuracy from a matching network and a controller for adjusting the matching network in response to the indicator. The controller ignites a plasma in a continuous wave (CW) mode by applying continuous RF power to a process gas within a chamber. Once the plasma is ignited, the controller adjusts the matching network until the indicator shows a desired match has been achieved. The, system is then switched into a pulse mode where the RF power is pulsed and the matching network tuning parameters are held constant during operation in the pulsed mode. As such, the controller does not tune the match unit during operation of the system in the pulsed mode.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
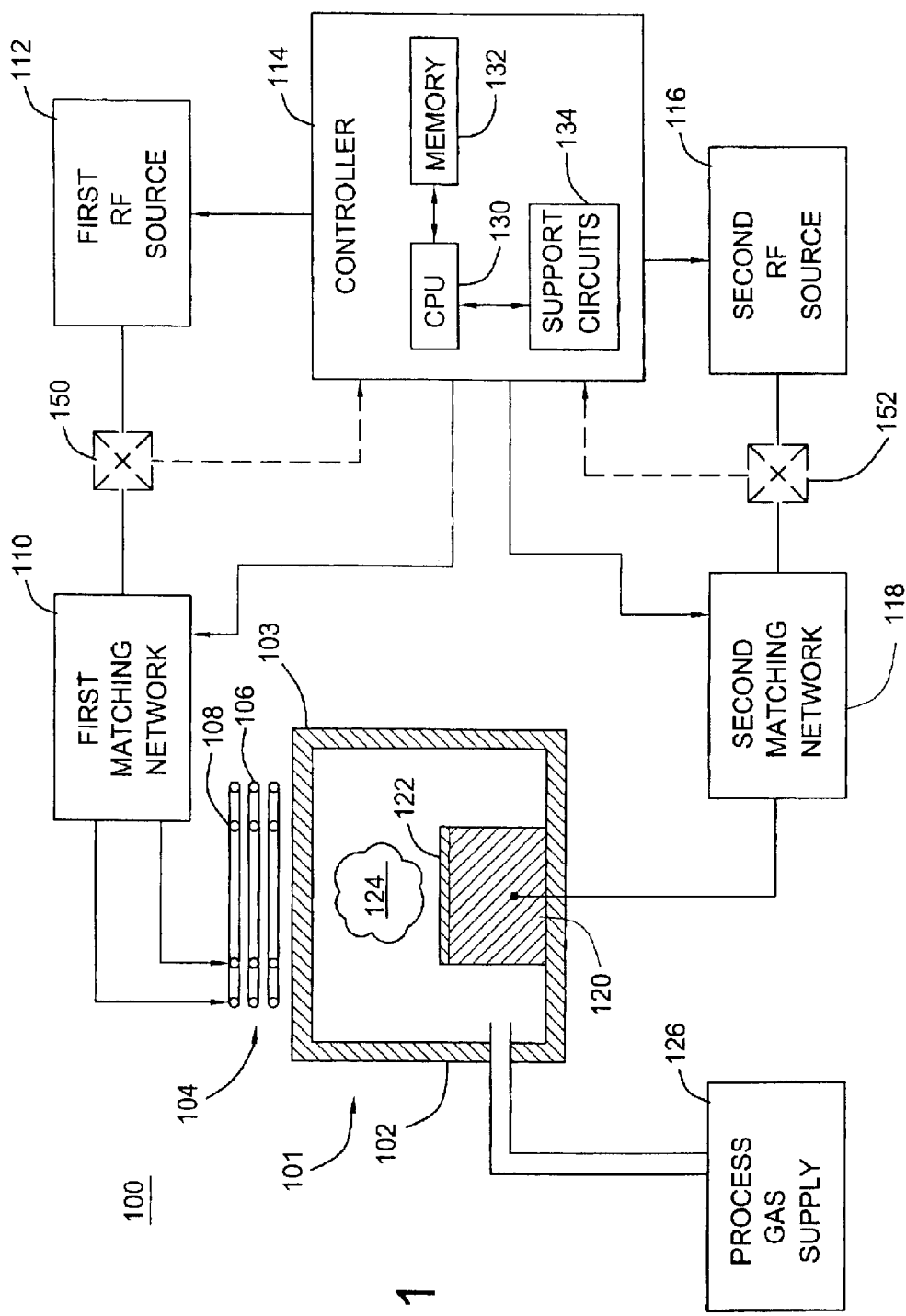
FIG. 1 is a schematic diagram of a semiconductor wafer processing system that utilizes the method and apparatus according to an embodiment of the present invention.

FIG. 1 is a plasma enhanced semiconductor wafer processing system 100 that in one embodiment is used for etching semiconductor wafers 122 (or other substrates and workpieces). Although the disclosed embodiment of the invention is described in the context of an etch reactor and process, the invention is applicable to any form of plasma process that uses pulsed power during a plasma enhanced process. Such reactors include plasma annealing, plasma enhanced chemical vapor deposition, physical vapor deposition, plasma cleaning, and the like.

This illustrative system 100 comprises an etch reactor 101, a process gas supply 126, a controller 114, a first RF power source 112, a second RF power source 116, a first matching network 110, and a second matching network 118. The etch reactor 101 comprises a vacuum vessel 102 that contains a cathode pedestal 120 that forms a pedestal for the wafer 122. The roof or lid 103 of the process chamber has at least one antenna assembly 104 proximate the roof 103. The antenna assembly 104, in one embodiment of the invention, comprises a pair of antennas 106 and 108. Other embodiments of the invention may use one or more antennas or may use and electrode in lieu of an antenna to couple RF energy to a plasma. In this particular illustrative embodiment, the antennas 106 and 108 inductively couple energy to the process gas or gases supplied by the process gas supply 126 to the interior of the vessel 102. The RF energy supplied by the antennas 106 and 108 is inductively coupled to the process gases to form a plasma 124 in a reaction zone above the wafer 122. The reactive gases will etch the materials on the wafer 122.

In one specific embodiment, the power to the antenna assembly 104 ignites the plasma 124 and power coupled to the cathode pedestal 120 controls the plasma 124. As such, RF energy is coupled to both the antenna assembly 104 and the cathode pedestal 120. The first RF power source 112 supplies energy to a first matching network 110 that then couples energy to the antenna assembly 104. Similarly, a second RF power source 116 couples energy to a second matching network 118 that couples energy to the cathode pedestal 120. A controller 114 controls the timing of activating and deactivating the RF power sources 112 and 116 as well as tuning the first and second matching networks 110 and 118. The power coupled to the antenna assembly 104 known as the source power and the power coupled to the cathode pedestal 120 is known as the bias power. In the embodiments of the invention, either the source power, the bias power or both can be operated in both a continuous wave (CW) mode and a pulsed mode.

A first indicator device 150 and a second indicator device 152 are used to determine the effectiveness of the matching networks' 110, 118 ability to match to the plasma 124. In one embodiment, the indicator devices 150 and 152 monitor the reflective power that is reflected from the respective matching networks 110, 118. These devices are generally integrated into the matching networks 110, 118, or power sources 112, 115; However, for descriptive purposes, they are shown here as being separate from the matching networks 110, 118. When reflected power is used as the indicator, the devices 150 and 152 are coupled between the sources 112, 116 and the matching networks 110 and 118. To produce a signal indicative of reflected power, the devices 150 and 152 are directional couplers coupled to a RF detector such that the match effectiveness indicator signal is a voltage that represents the magnitude of the reflected power. A large reflected power is indicative of an unmatched situation. The signals produced by the devices 150 and 152 are coupled to the controller 114. In response to an indicator signal, the controller 114 produces a tuning signal (matching network control signal) that is coupled to the matching networks 110, 118. This signal is used to tune the capacitor or inductors in the matching networks 110, 118. The tuning process strives to minimize or achieve a particular level of, for example, reflected power as represented in the indicator signal.

In one specific embodiment of the invention, the source power is applied in CW mode continuously throughout the process while the bias power is first applied in a CW mode to enable the second matching 118 network to be tuned to an appropriate value and then the bias power is applied in a pulse mode while the matching network parameters are held constant.

Figure 4:
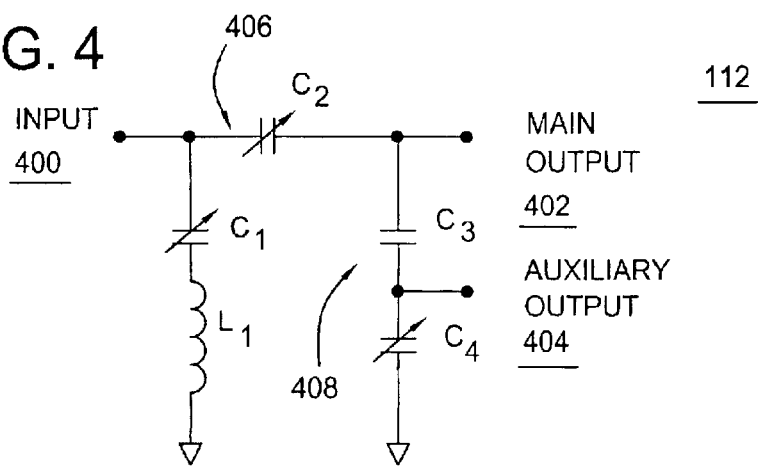
FIG. 4 is a schematic diagram of one embodiment of a matching network that can be used with the present invention.

FIG. 4 depicts a schematic diagram of one embodiment of a matching network used for example as the first RF matching network 110. This particular embodiment has a single input 400 and a dual output (i.e., main output 402 and auxiliary output 404). Each output is used to drive one of the two antennas. The matching circuit 406 is formed by C1, C2 and L1 and a capacitive power divider 408 is formed by C3 and C4. The capacitive divider values are set to establish a particular amount of power to be supplied to each antenna. The values of capacitors C1 and C2 are mechanically tuned to adjust the matching of the network 110. Either C1 or C2 or both may be tuned to adjust the operation of the network. In lower power systems, the capacitors may be electronically tuned rather than mechanically tuned. Other embodiments of a matching network may have a tunable inductor. This source power supply may be operated in pulse or CW mode. The source power that is matched by the network 110 is at about 13.56 MHz and has a power level of about 3000 watts. Such a matching network is available under model NAVIGATOR 3013-ICP85 from AE, Inc. of Fort Collins, Colo.

Figure 5:
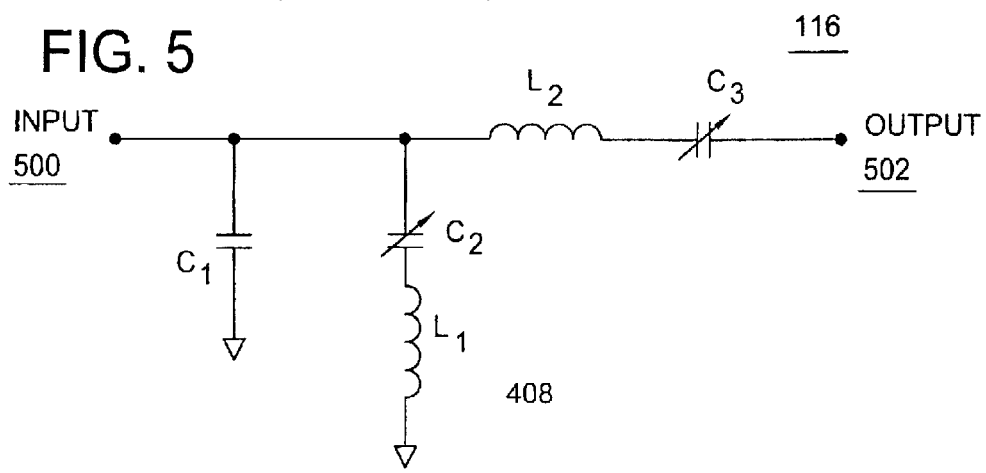
FIG. 5 is a schematic diagram of another embodiment of a matching network that can be used with the present invention.

FIG. 5 depicts a schematic diagram of one embodiment of a matching network used for example as the second RF matching network 118. This particular embodiment has a single input 500 and a single output 502. The output is used to drive the pedestal. The matching network comprises capacitors C1, C2, C3, L1 and L2. The values of capacitors C2 and C3 are mechanically tuned to adjust the matching of the network 116. Either C2 or C3 or both may be tuned to adjust the operation of the network. In lower power systems, the capacitors may be electronically tuned rather than mechanically tuned. Other embodiments of a matching network may have a tunable inductor. This bias power supply 116 may be operated in pulse or CW mode In pulse mode, pulses occur at a frequency of 100 Hz–10 KHz and a duty cycle of 10–90%. In one embodiment, bias power has a frequency of about 13.56 MHz and has a power level of about 1000 watts. Such a matching network is available under model NAVIGATOR 1013-L35Z from AE, Inc. of Fort Collins, Colo.

The controller 114 comprises a central processing unit (CPU) 130, a memory 132 and support circuits 134. The controller 114 is coupled to various components of the system 100 to facilitate control of the etch process. The controller 114 regulates and monitors processing in the chamber via interfaces that can be broadly described as analog, digital, wire, wireless, optical, and fiberoptic interfaces. To facilitate control of the chamber as described below, the CPU 130 may be one of any form of general purpose computer processor that can be used in an industrial setting for controlling various chambers and subprocessors. The memory 132 is coupled to the CPU 130. The memory 132, or a computer readable medium, may be one or more readily available memory devices such as random access memory, read only memory, floppy disk, hard disk, or any other form of digital storage either local or remote. The support circuits 134 are coupled to the CPU 130 for supporting the processor in a conventional manner. These circuits include cache, power supplies, clock circuits, input/output circuitry and related subsystems, and the like. Etching process instructions are generally stored in the memory 132 as a software routine typically known as a recipe. The software routine may also be stored and/or executed by a second CPU (not shown) that is remotely located from the hardware being controlled by the CPU 130. The software routine, when executed by CPU 130, transforms the general purpose computer into a specific purpose computer (controller) 114 that controls the system operation such as that for controlling the plasma during the etch process. Although the process of the present invention is discussed as being implemented as a software routine, some of the method steps that are disclosed therein may be performed in hardware as well as by the software controller. As such, the invention may be implemented in software as executed upon a computer system, and hardware as an application specific integrated circuit or other type of hardware implementation, or a combination of software and hardware.

Figure 2:
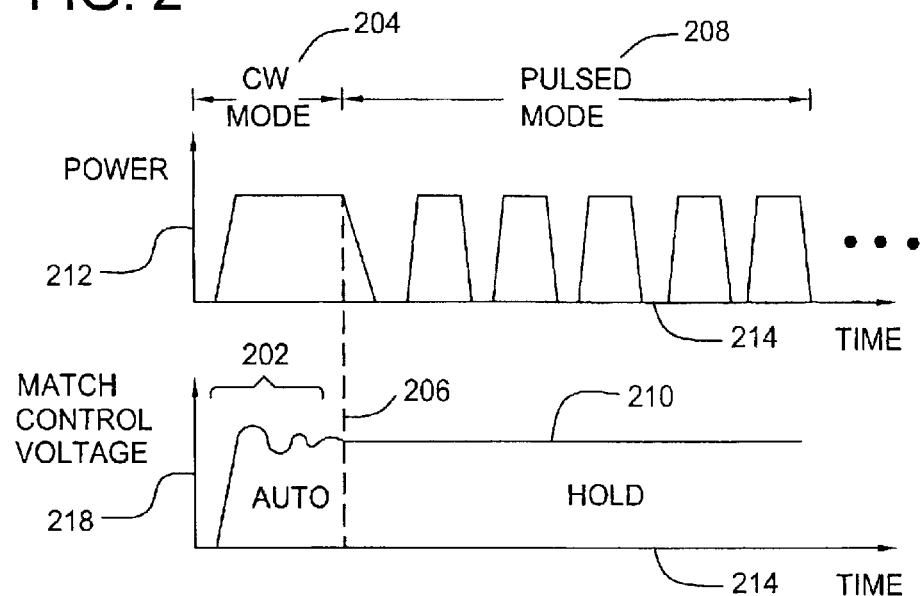
FIG. 2 is a timing diagram of the RF power applied to the processing chamber and the matching network control voltage versus time, where the matching network is adjusted in accordance with an embodiment of the present invention.

FIG. 2 depicts a timing diagram of time (axis 214) plotted against both the RF power (axis 212) applied to the cathode pedestal and the match control voltage (axis 218) used to control the second matching network 118 in the system 100 of FIG. 1. The controller 114 generally applies the RF power from the first RF power source 116 to the first matching network 110 and the antenna assembly 104 to ignite the plasma. The second RF power source 116 is then activated to apply, in CW mode, an RF power to the second matching network 118. During the CW mode, the matching network control voltage in region 202 that is applied during CW mode 204 is used to tune the second network 118 and achieve a low and stable reflected power (match indicator signal). In one embodiment, the CW mode, during which automatic tuning is performed, lasts for approximately 5 seconds. When the CW mode ends and the pulsed mode begins at point 206. The pulsed mode continues in region 208. During the pulsed mode, the match control signal is locked (held) to its last value that was used during the CW mode. As such, the matching network parameters are locked. The control signal used to tune the matching network parameters is held at a constant value during the entire pulsed mode 208. The held level is represented at reference number 210.

The process described for tuning and holding the matching network parameters can be applied to the matching networks for the source power, bias power or both. The technique of the invention can be used to operate any tunable matching network for efficiently applying pulsed RF power to a plasma within a plasma reactor. As such, the matching network matches the impedance of a RF power supply to the impedance of the plasma as driven by an antenna or electrode that is coupled to the marching network.

Figure 3:
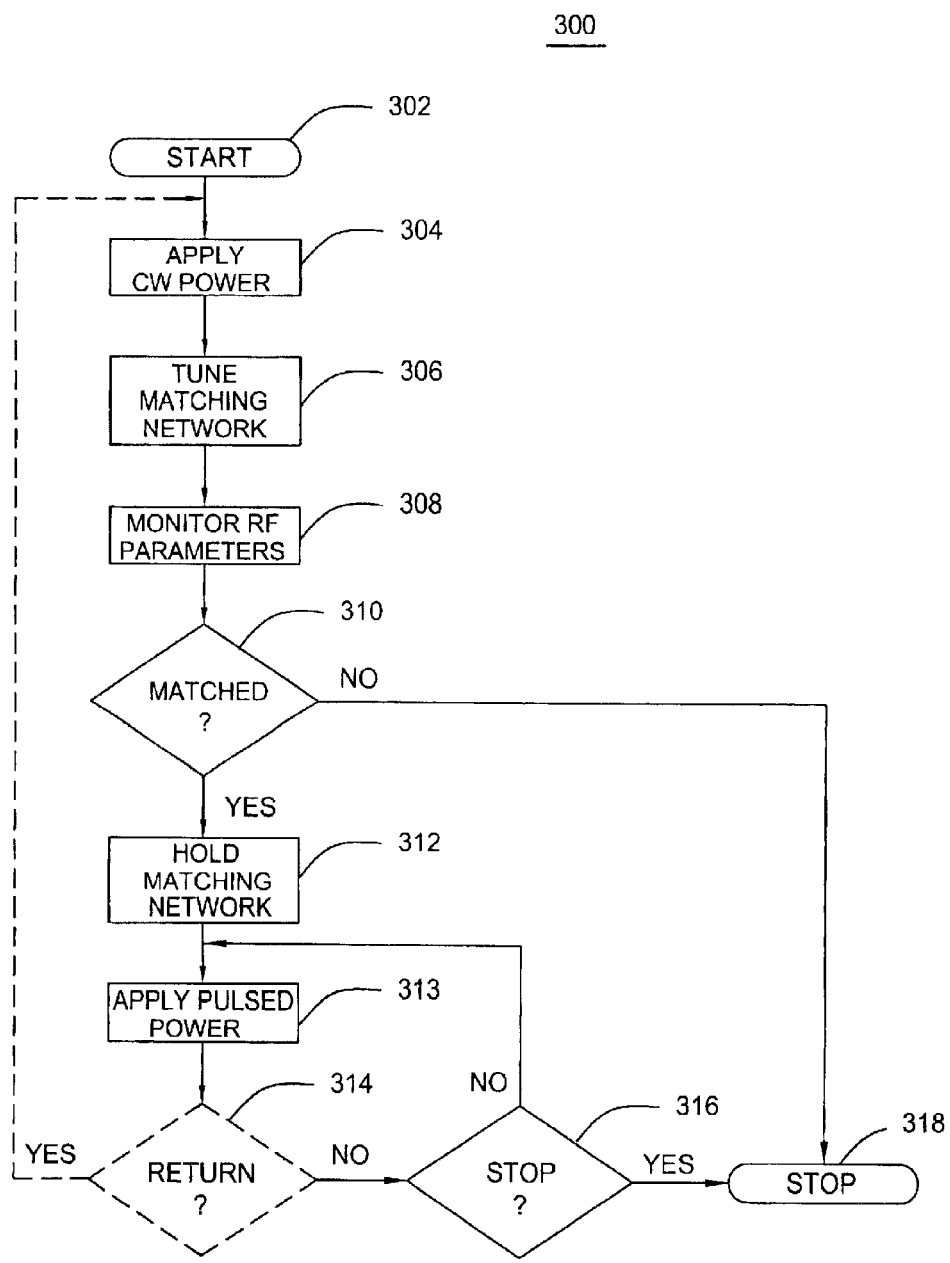
FIG. 3 is a flow diagram of a method of tuning a matching network in accordance with an embodiment of the present invention.

FIG. 3 is a method 300 that is performed by a plasma enhanced wafer processing system in accordance with an embodiment of the present invention. The method begins at step 302 and proceeds to step 304 where CW power is applied to the plasma during the CW mode. At step 306, the matching network is calibrated (tuned) by adjusting the capacitance or inductance values within the matching network toward obtaining a low reflected power or better plasma stability. At step 308, the method monitors plasma stability generally by monitoring the reflected power from the matching network or monitoring another indicator of effective matching. Many techniques for monitoring plasma stability are known in the art and could be used in this step.

At step 310, the method queries whether a stable plasma has been achieved through tuning the matching network i.e., query whether a desired level of match exists. If the query is negatively answered, the method 300 proceeds to step 318 where the plasma is extinguished and processing is stopped.

Once the match is achieved and the query 310 is affirmatively answered, the method proceeds to step 312 where the matching network parameters are held and, at step 313, the pulsed mode is begun. During the pulsed mode, pulsed RF power is applied from an RF power source to the matching network and to the cathode pedestal, antenna, electrode or other element for coupling the power to the process gas or gases. An optional step 314 may be executed if the process duration is long and a recalibration (retuning) of the matching network is necessary or desired. During the recalibration step 314, the process proceeds to step 304 where CW power is once again applied to allow the matching network to be calibrated prior to returning to applying the pulsed power. If recalibration is not necessary or desired, the method 300 proceeds to step 316 where the method queries whether the plasma process should be stopped. If the plasma process has not reached its end point, then the pulsed power application is continued at step 313. If the end point has been attained, then the etch process is stopped at step 318. In this manner, the matching network is calibrated using the CW power and then switched to a pulse mode holding the calibrated values constant during the pulsed mode. Consequently, the controller cannot cause incorrect calibration of the matching network during pulsed mode that will affect the plasma stability.

The foregoing description of the flow diagram of FIG. 3 described the steps as being sequential; however, those skilled in the art will understand that some of the steps may be performed in a different order or simultaneously to achieve the operation of the matching network in accordance with the invention.

The foregoing embodiments assume that the pulsed power was applied through the second matching network to the cathode pedestal. In other embodiments of the invention, the first matching network may also be controlled in the manner of FIG. 3 or both matching the first and second matching networks 110 and 118 can be controlled in accordance with FIG. 3.

While foregoing is directed to the preferred embodiment of the present invention, other and further embodiments of the invention may be devised without departing from the basic scope thereof, and the scope thereof is determined by the claims that follow.

What is claimed is:

1. A method of operating a matching network comprising:
applying continuous wave RF power to an antenna assembly to ignite a plasma;
applying continuous wave RF power to a substrate support member;
tuning a matching network in electrical communication with the substrate support member to achieve an impedance match between the continuous wave RF power applied to the substrate support member and a load;
holding the impedance match constant while applying pulsed RF power to at least one of the antenna assembly and the substrate support member.

2. The method of claim 1 wherein the impedance match is tuned by applying a control signal to adjust at least one impedance value of the matching network.

3. The method of claim 2 wherein the at least one impedance value is a capacitance.

4. The method of claim 1 wherein the applying continuous wave RF power to a substrate support member has a duration of about 5 seconds.

5. The method of claim 1 further comprising:

measuring a match effectiveness indicator to identify when a substantial impedance match is achieved.

6. The method of claim 5 wherein the match effectiveness indicator is a signal representing reflected power from the matching network.

7. The method of claim 1 wherein the load is a plasma in a plasma reactor.

8. The method of claim 7 wherein the load further comprises the antenna assembly.

9. The method of claim 7 wherein the load further comprises the cathode pedestal.

10. A method of operating a matching network comprising:

applying a first RF power to an antenna assembly to ignite a plasma;

applying a second RF power to a matching network, where the matching network is coupled to a cathode pedestal within a plasma enhanced plasma reactor, the second RF power is applied in a CW mode;

tuning matching parameters of the matching network during the CW mode;

upon achieving a desired impedance match using the matching network, holding the matching parameters constant; and applying the second RF power in a pulsed mode.

11. The method of claim 10 wherein the plasma enhanced reactor is an etch reactor.

12. The method of claim 10 wherein the CW mode lasts for 5 seconds.

* * * * *

UNITED STATES PATENT AND TRADEMARK OFFICE
CERTIFICATE OF CORRECTION

| | | |
|---|---|---|
| PATENT NO. | : 6,818,562 B2 | Page 1 of 1 |
| APPLICATION NO. | : 10/146394 | |
| DATED | : November 16, 2004 | |
| INVENTOR(S) | : Valentin Todorow, John Holland and Nicolas Gani | |

It is certified that error appears in the above-identified patent and that said Letters Patent is hereby corrected as shown below:

<u>Title Page</u> Item [73],
Add Assignee: Applied Materials, Inc., P.O. Box 450-A, Santa Clara, CA 95052

In column 2, line 28, after "The" delete ",".

In column 7, line 2, after "ous" delete "$_{13}$".

Signed and Sealed this

Twelfth Day of December, 2006

JON W. DUDAS
*Director of the United States Patent and Trademark Office*